United States Patent
Udagawa et al.

(10) Patent No.: US 6,750,464 B2
(45) Date of Patent: Jun. 15, 2004

(54) ALIGNMENT-MARK PATTERNS DEFINED ON A STENCIL RETICLE AND DETECTABLE, AFTER LITHOGRAPHIC TRANSFER TO A SUBSTRATE, USING AN OPTICAL-BASED DETECTOR

(75) Inventors: Jin Udagawa, Fukaya (JP); Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 171 days.

(21) Appl. No.: 09/997,854

(22) Filed: Nov. 29, 2001

(65) Prior Publication Data

US 2002/0079467 A1 Jun. 27, 2002

(30) Foreign Application Priority Data

Dec. 26, 2000 (JP) .................................. 2000-394415
Mar. 7, 2001 (JP) .................................. 2001-062887

(51) Int. Cl.[7] .............................................. G01N 21/86
(52) U.S. Cl. ................... 250/559.3; 250/492.2; 430/5
(58) Field of Search .................. 250/559.3, 237 R, 250/548, 492.2; 430/5, 296

(56) References Cited

U.S. PATENT DOCUMENTS 6,117,600 A * 9/2000 Nakasuji ..................... 430/30

OTHER PUBLICATIONS

U.S. patent application Ser. No. 09/518,431, Hirayanagi, filed Mar. 3, 2000.

* cited by examiner

Primary Examiner—Thanh X. Luu
(74) Attorney, Agent, or Firm—Klarquist Sparkman, LLP

(57) ABSTRACT

Alignment-mark patterns are disclosed that are defined on stencil reticles and that can be transferred lithographically from the reticle to a sensitized substrate using charged-particle-beam microlithography. The corresponding alignment marks as transferred to the substrate are detectable at high accuracy using an optical-based alignment-detection device (e.g., an FIA-based device). The transferred alignment marks can be used in place of alignment marks used in optical microlithography systems. An alignment-mark pattern as defined on a stencil reticle includes pattern elements that are split in any of various ways into respective pattern-element portions separated from each other on the membrane of the stencil reticle by "girders" (band-like membrane portions) that prevent the formation of islands in the stencil reticle and that prevent deformation of the pattern elements on the stencil reticle.

30 Claims, 7 Drawing Sheets

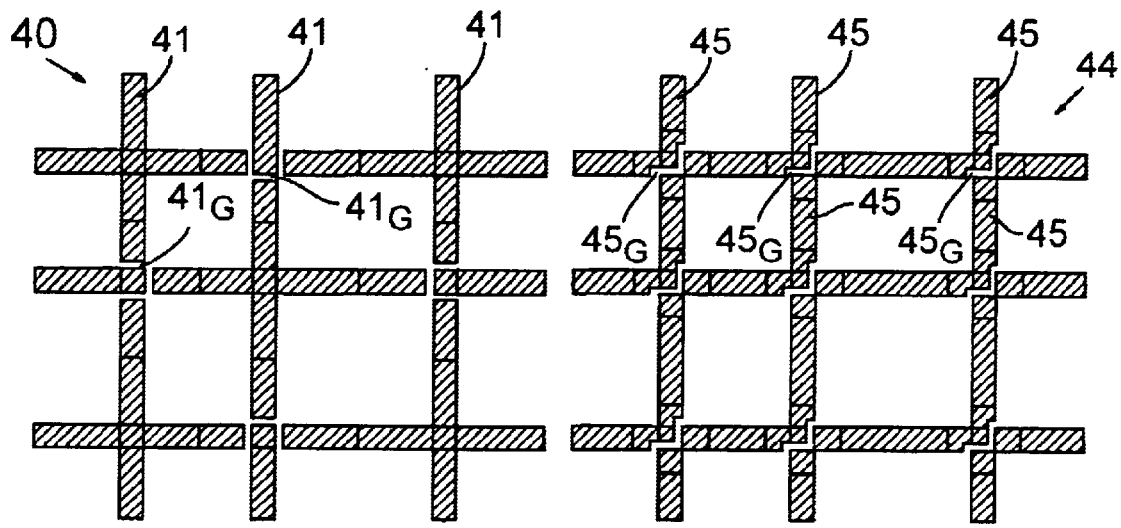
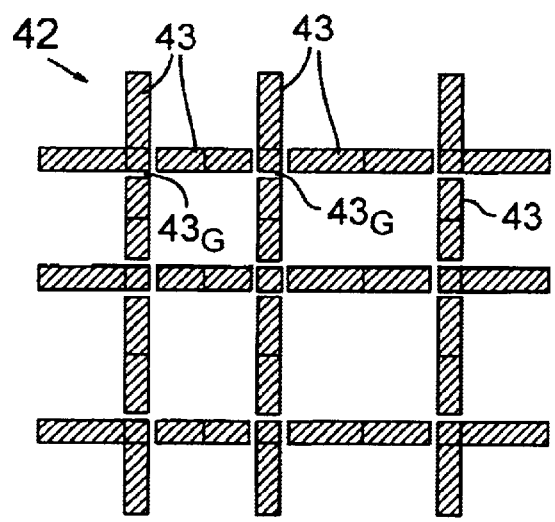
FIG. 4(A)
FIG. 4(B)
FIG. 4(C)

ALIGNMENT-MARK PATTERNS DEFINED ON A STENCIL RETICLE AND DETECTABLE, AFTER LITHOGRAPHIC TRANSFER TO A SUBSTRATE, USING AN OPTICAL-BASED DETECTOR

FIELD

This disclosure pertains to microlithography, which involves the transfer of an image of a pattern to the surface of a "sensitized" substrate using an energy beam such as ultraviolet light or a beam of charged particles. Microlithography is a key technology used in the fabrication of microelectronic devices such as integrated circuits, displays, thin-film magnetic-pickup heads, and micromachines. More specifically, the disclosure pertains to alignment marks that are used mainly for aligning and detecting the position of the substrate while performing a microlithographic exposure of the substrate. The disclosure also pertains to alignment-mark patterns, as defined on a reticle, corresponding to such alignment marks.

BACKGROUND

In recent years, the inability of optical microlithography to resolve increasingly finer pattern features has been an obstacle to obtaining currently desired levels of integration and miniaturization of microelectronic devices. Hence, large efforts are ongoing to develop a practical "next-generation" microlithography technology that can achieve satisfactory resolution of substantially finer pattern features than resolvable using optical microlithography.

Microlithography performed using a charged particle beam is a major candidate next-generation microlithography technology. Charged-particle-beam (CPB) microlithography offers prospects of substantially better resolution than optical microlithography for reasons similar to the reasons for which electron microscopy yields better imaging resolution than optical microscopy. An ongoing technical challenge with current CPB microlithography approaches is the attainment of satisfactory throughput.

Another technical challenge with CPB microlithography is a more general problem that arises in any of various efforts to achieve substantially greater imaging resolution (i.e., resolution of smaller pattern linewidths), either by CPB microlithography or other type of microlithography. Namely, the greater the desired imaging resolution, the greater the required accuracy of position detection of, inter alia, the lithographic substrate.

Conventionally, detection of substrate position in a microlithography apparatus is accomplished using an alignment device that detects the respective positions of alignment marks associated with the substrate, e.g., alignment marks defined in or on the surface of the substrate. Exemplary optical-alignment devices include devices based on field image alignment (FIA), which detect alignment marks using a two-dimensional image sensor such as a CCD or the like and perform image processing to obtain position data. The alignment marks for FIA usually are situated on the substrate and are formed by exposing an alignment-mark pattern, defined by a mask or reticle, onto the surface of the substrate.

In view of the fact that many layers are formed on the substrate during fabrication of microelectronic devices on the substrate, alignment marks normally are formed at least in the first layer exposed onto the substrate. Hence, the reticle defining the circuit pattern to be formed in the first layer typically includes an alignment-mark pattern, and both the first-layer circuit pattern and the alignment marks are transferred lithographically from the reticle to the substrate. In addition to the first layer, one or more layers formed subsequent to the first layer also can include respective alignment marks that are transferred to the substrate as required.

Depending upon the type of microelectronic devices being fabricated on the substrate, lithographic pattern exposures can be performed using several types of microlithography apparatus rather than only one type. For example, some layers can be exposed using a CPB microlithography apparatus, and other layers can be exposed using an optical (deep ultraviolet) microlithography apparatus. The reason for this flexibility is that certain layers may have smaller minimum linewidths than other layers, and it is desirable from the standpoint of throughput and other concerns to utilize, for a particular layer, the most efficient lithographic exposure method that also produces the desired linewidth resolution. Hence, it is desirable that the alignment marks formed on the substrate be usable for obtaining high-accuracy position detection by optical means as well as by CPB means.

FIGS. 10(A)–10(B) depict respective examples of alignment marks usable for FIA (which, as noted above, is an optically based alignment-detection method and is used in conventional optical microlithography apparatus). The alignment marks consist of alignment-mark elements (denoted by respective shaded portions in the figures) defined as corresponding through-holes (apertures) in the respective mask. Regarding the alignment mark 10 shown in FIG. 10(A), certain elements $10_V$ are oriented vertically in the figure and other elements $10_H$ are oriented horizontally in the figure. The alignment-mark elements $10_V$, $10_H$ intersect each other. Regarding the alignment mark 11 shown in FIG. 10(B), certain alignment-mark elements $11_V$ are oriented vertically and other alignment-mark elements $11_H$ are oriented horizontally. Respective groups of horizontal elements $11_H$ and vertical elements $11_V$ are arranged in respective parallel arrays, but do not intersect each other. The exemplary marks shown in FIGS. 10(A) and 10(B) provide good two-dimensional detection accuracy using optical alignment detectors and hence are used in many optical microlithography systems.

As noted above, different layers formed on a substrate need not be formed using the same microlithography technology. For example, one layer can be formed using CPB microlithography, and the next layer can be formed using optical microlithography. In the case of the marks shown in FIGS. 10(A)–10(B), if the first layer is to be formed on the substrate using CPB microlithography (wherein the respective pattern as well as the alignment-mark patterns are defined on a stencil reticle), a problem arises with respect to the alignment-mark patterns as defined on the reticle. Specifically, in the case of the alignment mark 10 shown in FIG. 10(A), the corresponding alignment-mark pattern as defined on the reticle is a "donut" pattern. I.e., the alignment-mark elements $10_V$, $10_H$ are defined by respective apertures in the reticle. However, as can be seen, the apertures completely surround "islands" $10_I$ in a donut manner, leaving the islands $10_I$ without any physical support on the reticle. Complete "donut" elements cannot be defined on a stencil-type reticle. In the case of the alignment mark 11 shown in FIG. 10(B), defining the corresponding alignment-mark pattern 11 on a stencil reticle poses a high probability of deformation of the alignment-mark elements $11_H$, $11_V$ (e.g., warping and/or twisting) due to stress in the reticle.

In view of the foregoing, if exposure of the first layer is to be performed by CPB microlithography using a stencil reticle, then there is an urgent need for alignment marks that are definable in the first layer and that can be detected with good accuracy and precision using an optically based alignment-detection device.

SUMMARY

To address the above and other shortcomings of conventional alignment marks and associated methods, the present invention provides, inter alia, alignment-mark patterns that can be defined on a stencil reticle for transfer using a charged particle beam to a sensitized substrate such as a resist-coated semiconductor wafer. As imprinted on the substrate, the corresponding alignment marks can be used for highly accurate alignments performed using an optically based alignment-detection device (e.g., a detection device based on FIA).

According to a first aspect of the invention, alignment-mark patterns are provided that are defined on a stencil reticle used in charged-particle-beam microlithography. The alignment-mark patterns are configured to be lithographically transferred by a charged particle beam from the stencil reticle to a sensitized substrate so as to imprint on the substrate a corresponding alignment mark detectable using an optical-based alignment-detection device. An embodiment of such an alignment-mark pattern comprises pattern elements defined as respective apertures in the stencil reticle. Each of the pattern elements on the reticle is split into respective pattern-element portions that are separated by respective girders formed from a membrane of the stencil reticle. Splitting of the pattern elements and interposing girders between adjacent pattern-element portions avoid forming membrane islands in the reticle and prevent stress-based deformation of the pattern elements in the reticle. Such an alignment-mark pattern, when projected onto the surface of a suitable substrate, yields a corresponding alignment mark allowing substrate-position (alignment) detection to be performed with high accuracy in either a charged-particle-beam (CPB) microlithography apparatus or an optical microlithography apparatus. In other words, as various lithographic procedures are performed on the substrate, the same alignment marks can be used without sacrificing accuracy.

The alignment-mark pattern can comprise pattern elements that include intersecting pattern elements. In such an instance, the girders can extend across respective pattern elements at regions of intersection of the corresponding alignment-mark elements. The pattern elements also can include girders that extend across respective pattern elements at regions displaced from regions of intersection.

Alternatively, the alignment-mark pattern can be only of pattern elements that do not intersect with each other. In such an instance, the pattern elements can include a first group of pattern elements that are separate from but oriented perpendicularly to a second group of pattern elements.

Desirably, in the corresponding alignment mark on the substrate, each alignment-mark girder has a width that is no greater than a resolution limit of the optical-based alignment-detection device. Thus, alignment-measurement accuracy is not compromised compared to that obtained with an alignment mark transferred from an alignment-mark pattern that is not split.

According to another aspect of the invention, stencil reticles are provided for use in CPB microlithography. An embodiment of such a reticle comprises a reticle membrane and an alignment-mark pattern. The alignment-mark pattern comprises multiple pattern elements defined as respective apertures in the reticle membrane. The alignment-mark pattern is configured to be transferred lithographically by a charged particle beam from the stencil reticle to a sensitized substrate so as to imprint on the substrate a corresponding alignment mark that is detectable using an optical-based alignment-detection device. Each of the pattern elements on the reticle is split into respective pattern-element portions, separated by respective girders formed from the reticle membrane, so as to avoid forming membrane islands in the reticle and to prevent stress-based deformation of the pattern elements in the reticle. Generally, the reticle also defines a device pattern normally defined in a first region of the reticle, wherein the alignment-mark pattern is defined in a second region of the reticle separate from the first region.

In the various embodiments of a stencil reticle, the pattern elements of the alignment-mark patterns can have any of the various configurations summarized above.

The reticle membrane desirably is made of a charged-particle-scattering material, thereby avoiding absorption of incident charged particles by the reticle. Avoiding absorption reduces temperature increases otherwise experienced by reticles during use in a CPB microlithography apparatus. Reducing temperature increases results in suppression of pattern deformation as defined on the reticle.

According to another aspect of the invention, stencil reticles are provided that include an alignment-mark pattern such as any of those summarized above. The reticles desirably are scattering-stencil reticles.

Yet another aspect of the invention is directed to methods, in the context of microlithographic methods, for determining an alignment of a lithographic substrate. According to an embodiment, on a stencil reticle defining an alignment-mark pattern comprising pattern elements defined as respective apertures in a membrane of the stencil reticle, each of the pattern elements on the reticle is split into respective pattern-element portions. The pattern-element portions are separated from each other by respective girders formed from the membrane. This splitting of pattern elements with intervening girders avoids forming membrane islands in the reticle and prevents stress-based deformation of the pattern elements in the reticle. The alignment-mark pattern on the reticle is transferred lithographically to a sensitized substrate using a charged particle beam so as to imprint the corresponding alignment mark on the substrate. The alignment mark is detected to determine alignment of the substrate. Desirably, the detecting step is performed using an optical-based alignment-detection device, such as an FIA-based device.

In the defining step of the foregoing method embodiment, the alignment-mark elements can be defined in any of various ways as summarized above. The detecting step can be performed using an optical-based alignment-detection device. If so, then each alignment-mark girder desirably is configured to have a width that is no greater than a resolution limit of the optical-based alignment-detection device.

The foregoing and additional features and advantages of the invention will be more readily apparent from the following detailed description, which proceeds with reference to the accompanying drawings.

BRIEF DESCRIPTION OF THE DRAWINGS

FIGS. 4(A)–4(C) are plan views of respective alternative configurations of split FIA alignment-mark patterns according to a fourth representative embodiment, as defined on a stencil reticle. The alignment-mark patterns are split such that certain pattern elements cross each other and other pattern elements do not. Exemplary portions of the respective alignment-mark patterns are shown.

DETAILED DESCRIPTION

The invention is described in the context of representative embodiments, which are not intended to be limiting in any way.

Figure 1A:
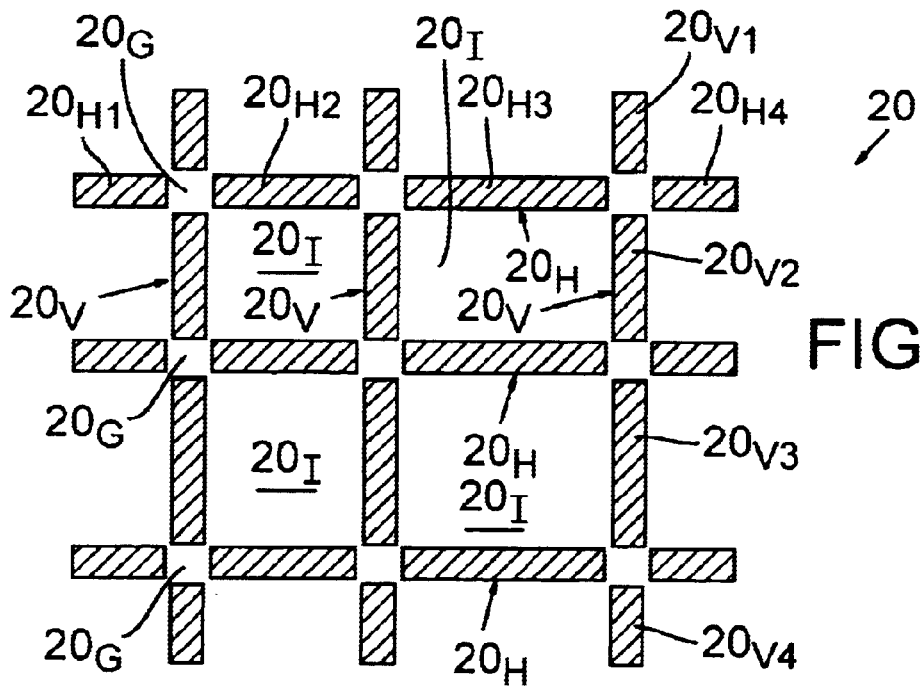
FIGS. 1(A)–1(B) are plan views of respective alternative configurations of split FIA alignment-mark patterns according to a first representative embodiment, as defined on a stencil reticle. The alignment-mark patterns are split such that the alignment-mark elements do not intersect with each other. Exemplary portions of the respective alignment-mark patterns are shown.
Figure 1B:
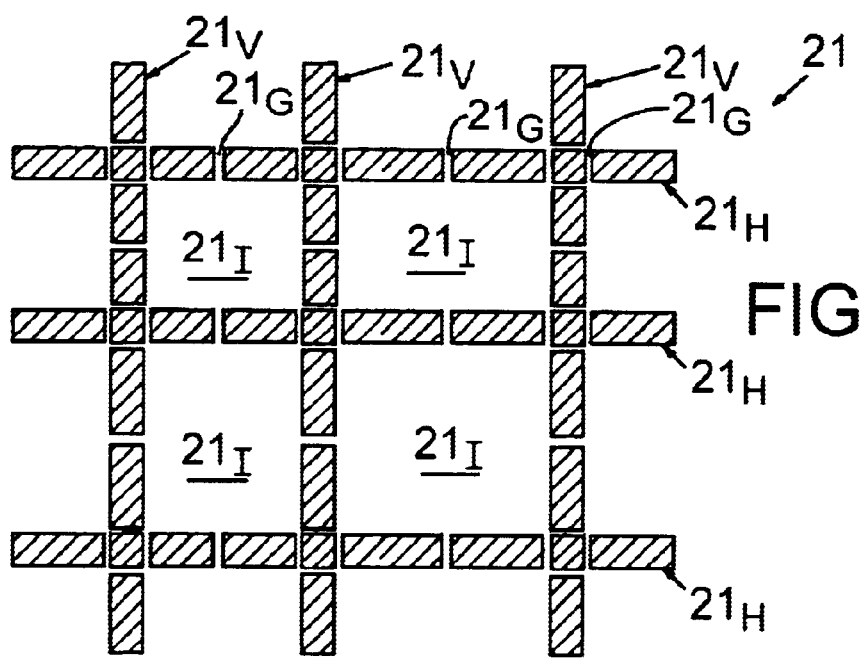
Figure 10A:
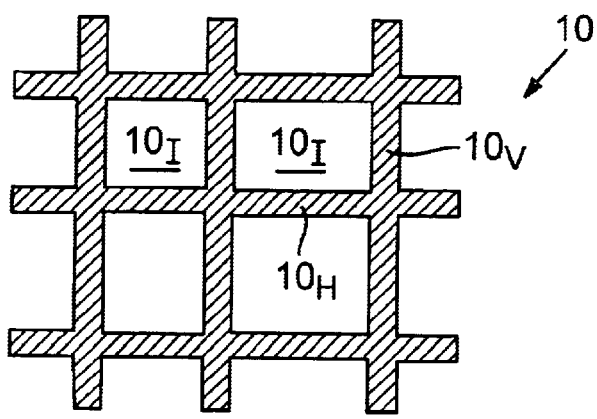
FIGS. 10(A)–10(B) depict respective examples of conventional alignment marks as usable in an alignment-detection scheme based on FIA (field image alignment), as used in conventional optical microlithography systems.
Figure 10B:
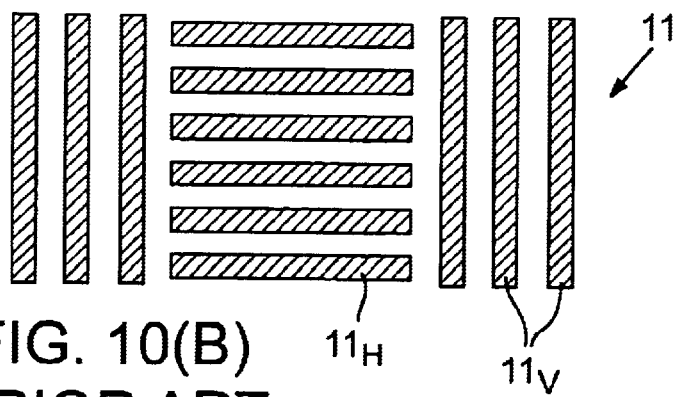

FIGS. 1(A)–1(B) depict respective alternative configurations of alignment-mark patterns according to a first representative embodiment. As discussed above, the conventional alignment marks shown in FIGS. 10(A)–10(B) present the "donut" problem and thus cannot be defined as such on a stencil reticle suitable for use in charged-particle-beam (CPB) microlithography. According to this first representative embodiment, the pattern elements that are defined by respective apertures in a stencil reticle are split so as to provide physical support for island regions of the marks and thus avoid the donut problem.

Turning first to FIG. 1(A), the alignment-mark pattern 20 comprises pattern elements $20_H$ that are oriented horizontally in the figure and pattern elements $20_V$ that are oriented vertically in the figure. On a stencil reticle, the non-shaded portions of the figure are respective portions of a reticle membrane, and the shaded portions (corresponding to the pattern elements $20_H$, $20_V$) are respective through-holes (apertures) in the reticle membrane. Each pattern element $20_H$, $20_V$ is split into respective non-contiguous pattern-element portions $20_{H1}$–$20_{H4}$, $20_{V1}$–$20_{V4}$ (each being rectilinear in profile in the figure) that do not intersect each other. Thus, in the alignment-mark pattern 20 as formed on a stencil reticle, regions $20_I$ surrounded by pattern elements $20_H$, $20_V$ are not true islands and thus have some physical support on the reticle by membrane portions ("girders") $20_G$ extending between the pattern-element portions. Thus, the donut problem is avoided.

On the substrate, if the alignment-mark girders formed by splitting the pattern elements on the reticle are too large, then there is a risk that the suitability of the corresponding alignment mark for high-accuracy position detection (e.g., by FIA) will be compromised. In such an instance, the pattern elements can be split in a manner such as in the alignment-mark pattern 21 of FIG. 1(B), in which the pattern elements $21_H$, $21_V$ are divided into respective pattern-element portions separated from each other by thin girders $21_G$. Desirably, on the substrate, each alignment-mark girder has a line width that is finer than the resolution limit of the FIA optical system used for alignment-mark detection. Thus, measurement accuracy by FIA is not compromised.

Generally, the resolution limit of an FIA optical system is a function of the wavelength λ of the alignment-detection light source and the numerical aperture NA of the FIA optical system. The relationship is expressed as follows:

Resolution limit=λ/NA

For example, if the wavelength of the FIA light source is λ=550 nm (approximately the median wavelength of white light), and the NA of the FIA optical system is 0.3, then the resolution limit is approximately 1.83 μm. Accordingly, on the substrate, if the width of the alignment-mark girders is 1.83 μm or less, then the alignment-mark girders will not be resolved by the FIA optical system. Hence, the corresponding alignment mark on the substrate provides an alignment-detection accuracy that is essentially the same as the accuracy obtained using the alignment mark 10 of FIG. 10(A), in which the alignment-mark elements are not split.

Figure 2A:
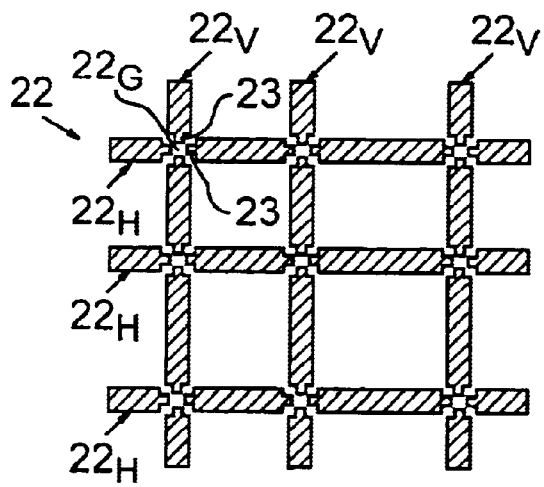
FIGS. 2(A)–2(D) are plan views of respective alternative configurations of split FIA alignment-mark patterns according to a second representative embodiment, as defined on a stencil reticle. The alignment-mark patterns are split such that the pattern elements do not intersect with each other. Exemplary portions of the respective alignment-mark patterns are shown.
Figure 2C:
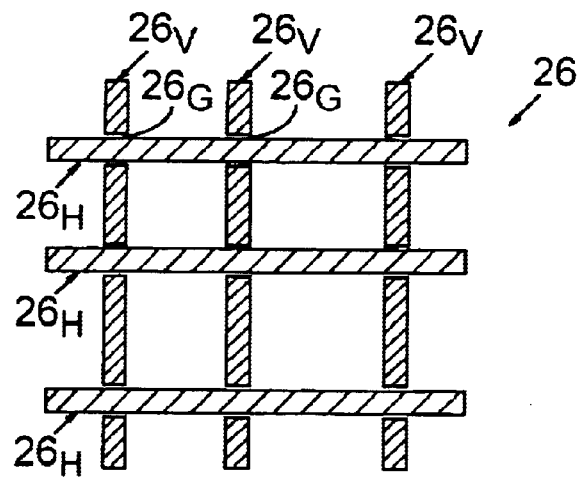
Figure 2B:
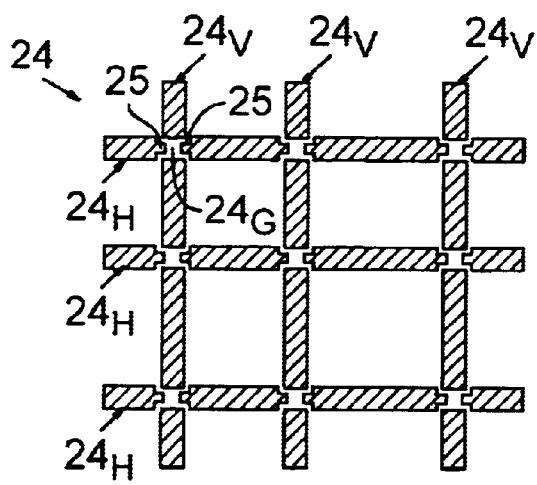
Figure 2D:
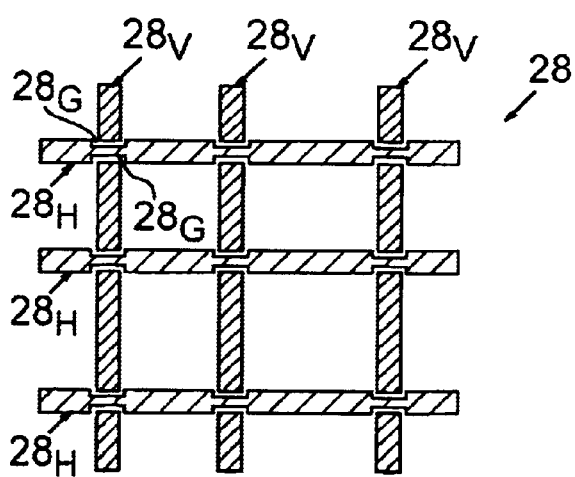

FIGS. 2(A)–2(D) depict respective alternative configurations of alignment-mark patterns according to a second representative embodiment, in which the constituent pattern elements are split to avoid intersection of pattern elements oriented vertically in the figures with pattern elements oriented horizontally in the figures, thereby avoiding the "donut" problem. In FIG. 2(A), the alignment-mark pattern 22 comprises "horizontal" pattern elements $22_H$ and "vertical" pattern elements $22_V$ that are split both vertically and horizontally. At each split the termini of the respective pattern-element portions have respective minute projections 23 extending into the respective girder $22_G$. In FIG. 2(B), the alignment-mark pattern 24 comprises "horizontal" pattern elements $24_H$ that are split in a manner similar to that shown in FIG. 2(A), wherein each pattern-element portion has a respective minute projection 25 on each terminus extending into the respective girder $24_G$. The "vertical" pattern elements $24_V$ in FIG. 2(B) are split into respective pattern-element portions each having a rectilinear configuration. In FIG. 2(C), the alignment-mark pattern 26 comprises non-split "horizontal" pattern elements $26_H$ and split "vertical" pattern elements $26_V$. (Alternatively, the "vertical" pattern elements could be non-split and the "horizontal" pattern elements could be split.) Each of the respective pattern-element portions of the "vertical" pattern elements $26_V$ has a rectilinear configuration, and a respective girder $26_G$ extends between the terminus of each "vertical" pattern-element portion and the adjacent "horizontal" pattern element $26_H$. In FIG. 2(D), the alignment-mark pattern 28 comprises "horizontal" pattern elements $28_H$ and "vertical" pattern elements $28_V$. In the figure, the "vertical" pattern elements $28_V$ are split in a manner similar to the configuration of FIG. 2(C). The "horizontal" pattern elements $28_H$ are not split. However at respective locations on each "horizontal" pattern element $28_H$ adjacent opposing termini of respective "vertical" pattern-element portions, the "horizontal" pattern element is constricted, with respective girders $28_G$ extending therebetween.

In any of the configurations shown in FIGS. 2(A)–2(D), the respective alignment-mark patterns comprise respective pattern elements that do not intersect with each other. As a result, each configuration as defined on a stencil reticle avoids the donut problem. A stencil reticle defining any of these alignment-mark patterns can be used to form the respective alignment mark on a sensitized substrate simultaneously with forming the first layer on the substrate by CPB microlithography.

Figure 3A:
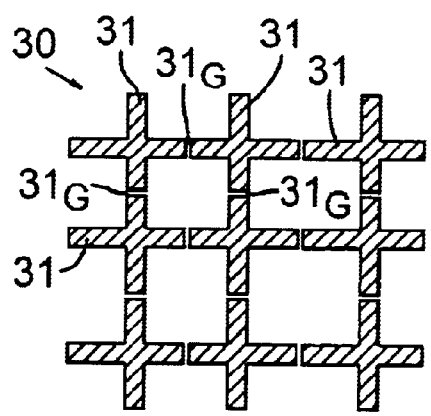
FIGS. 3(A)–3(C) are plan views of respective alternative configurations of split FIA alignment-mark patterns according to a third representative embodiment, as defined on a stencil reticle. The alignment-mark patterns are split in regions of the pattern elements other than regions in which the pattern elements cross each other. Exemplary portions of the respective alignment-mark patterns are shown.
Figure 3B:
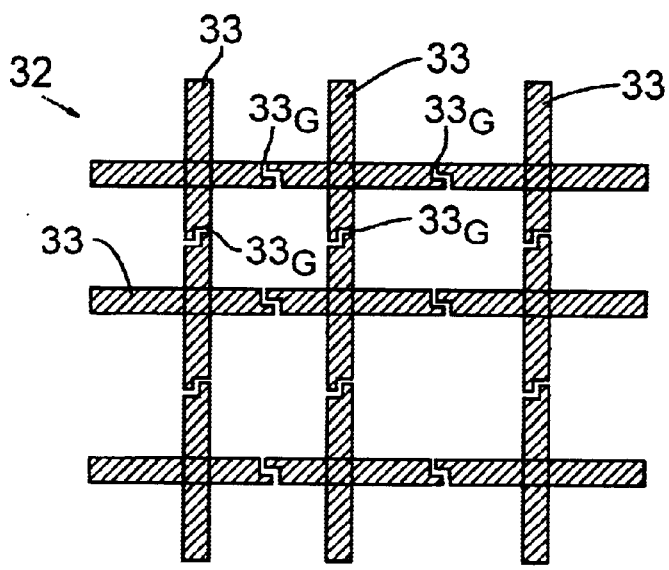
Figure 3C:
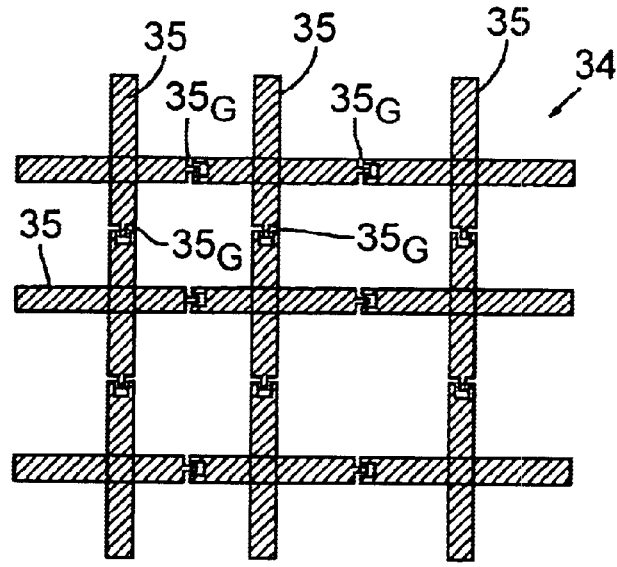

FIGS. 3(A)–3(C) depict respective alternative configurations of alignment-mark patterns according to a third representative embodiment, in which the constituent pattern elements are split to avoid the donut problem. The respective alignment-mark patterns shown in FIGS. 3(A)–3(C) differ from the respective alignment-mark patterns shown in FIGS. 1(A)–1(B) and FIGS. 2(A)–2(D) in that, in FIGS. 3(A)–3(C), "vertical" pattern elements and "horizontal" pattern elements intersect with each other. However, the respective pattern elements are split in locations other than regions of intersection. In FIG. 3(A), the alignment-mark pattern 30 is split into multiple "+"-shaped bi-dimensional pattern elements 31 that are separated from each other by intervening linear girders $31_G$. The respective termini of each pattern element 31 are rectilinear, and the girders $31_G$ are located mid-way between the intersection in each pattern element 31. In FIG. 3(B), the alignment-mark pattern 32 is split into multiple "+"-shaped pattern elements 33 that are separated from each other by intervening crank-shaped girders $33_G$. The girders $33_G$ are located mid-way between the intersection in each pattern element 33. In FIG. 3(C), the alignment-mark pattern 34 is split into multiple pattern elements 35 that are separated from each other by intervening girders $35_G$ defined by respective spaces between "tongue-and-groove" termini of the pattern elements 35.

In any of the configurations shown in FIGS. 3(A)–3(C), the respective alignment-mark patterns comprise respective pattern elements that do not intersect with each other. As a result, each configuration as defined on a stencil reticle avoids the donut problem. A stencil reticle defining any of these alignment-mark patterns can be used to form the respective alignment mark on a sensitized substrate simultaneously with forming the first layer on the substrate by CPB microlithography.

FIGS. 4(A)–4(C) depict respective alternative configurations of alignment-mark patterns according to a fourth representative embodiment, in which the constituent pattern elements are split to avoid the donut problem. In each of FIGS. 4(A)–4(C), the respective alignment-mark patterns 40, 42, 44 are split such that the pattern elements include portions that intersect and portions that do not intersect. For example, in FIG. 4(A), the respective alignment-mark pattern 40 comprises various "+"-shaped and rectilinear pattern elements 41 having termini separated from each other by straight girders $41_G$. In FIG. 4(B), the respective alignment-mark pattern 42 comprises various rectilinear and angled pattern elements 43 having termini separated from each other by straight girders $43_G$. In FIG. 4(C), the respective alignment-mark pattern 44 comprises various pattern elements 45 each having a more complex profile than the pattern elements in FIGS. 4(A) and 4(B). Between the pattern elements 45 are respective girders $45_G$ each having a zig-zag shape.

In any of the configurations shown in FIGS. 4(A)–4(C), the respective alignment-mark patterns comprise respective pattern elements that do not intersect with each other. As a result, each configuration as defined on a stencil reticle avoids the donut problem. A stencil reticle defining any of these alignment-mark patterns can be used to form the respective alignment mark on a sensitized substrate simultaneously with forming the first layer on the substrate by CPB microlithography.

As understood from the representative embodiments discussed above, it will be understood that any of various pattern-division schemes can be utilized to avoid the donut problem in a stencil reticle defining an alignment-mark pattern having pattern elements that effectively intersect each other. I.e., the shapes, numbers, and positions of the girders are not limited to the examples shown in the figures.

Figures 5A, 5C:
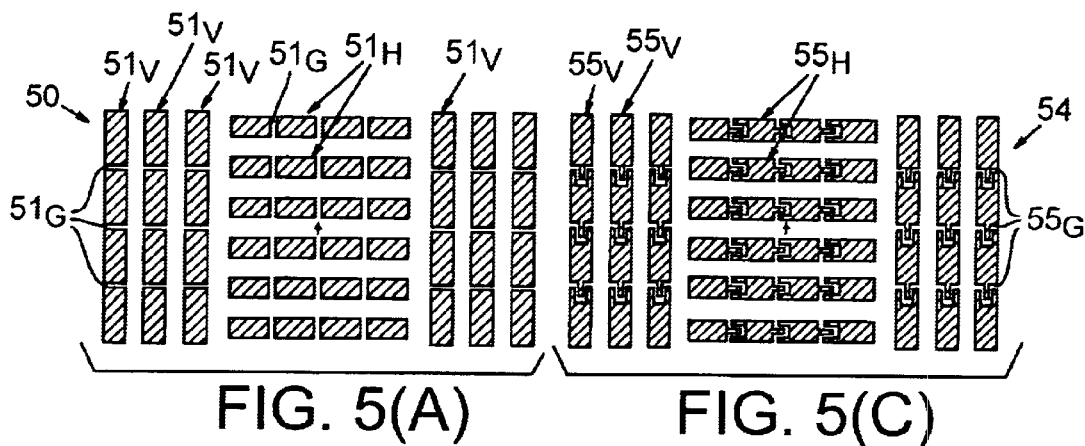
FIGS. 5(A)–5(C) are plan views of respective alternative configurations of split FIA alignment-mark patterns according to a fifth representative embodiment, as defined on a stencil reticle. Although the pattern elements do not cross each other, they are split to avoid deformation such as by reticle stress. Exemplary portions of the alignment-mark patterns are shown.
Figure 5B:
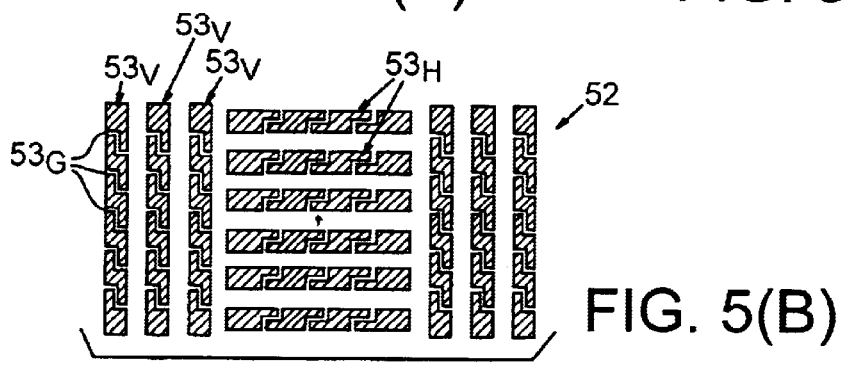

FIGS. 5(A)–5(C) depict respective alternative configurations of alignment-mark patterns according to a fifth representative embodiment. The alignment-mark patterns according to this representative embodiment have an overall profile similar to the alignment mark 11 of FIG. 10(B), except that the alignment-mark patterns according to this representative embodiment are split, as discussed later below. As noted in the discussion of FIG. 10(B), the alignment mark 11 comprises some alignment-mark elements that are linearly extended in the "vertical" direction (in the figure) and other alignment-mark elements that are linearly extended in the "horizontal" direction (in the figure). Conventionally, the corresponding pattern elements defined in a stencil reticle are prone to deformation such as warping and/or twisting. The various schemes of splitting the pattern elements as depicted in FIGS. 5(A)–5(C) solve this problem.

For example, in FIG. 5(A), the alignment-mark pattern 50 comprises multiple "horizontal" pattern elements $51_H$ and multiple "vertical" pattern elements $51_V$. Each pattern element $51_H$, $51_V$ is split into multiple rectilinear pattern-element portions. Between each pair of adjacent pattern-element portions is a respective straight girder $51_G$. In FIG. 5(B), the alignment-mark pattern 52 comprises multiple "horizontal" pattern elements $53_H$ and multiple "vertical" pattern elements $53_V$. Each pattern element $53_H$, $53_V$ is split into multiple pattern-element portions, wherein between each pair of adjacent pattern-element portions is a respective crank-shaped girder $53_G$. In FIG. 5(C), the alignment-mark pattern 54 comprises multiple "horizontal" pattern elements $55_H$ and multiple "vertical" pattern elements $55_V$. Each pattern element $55_V$, $55_V$ is split into multiple pattern-element portions. The termini of adjacent pattern-element portions have a tongue-and-groove configuration defining a respective girder $55_G$ therebetween. By splitting the alignment-mark patterns in any of the manners described above, the problem of stress-induced deformation and twisting of the corresponding pattern elements (as defined in a stencil reticle) is avoided.

Figures 6A, 6C:
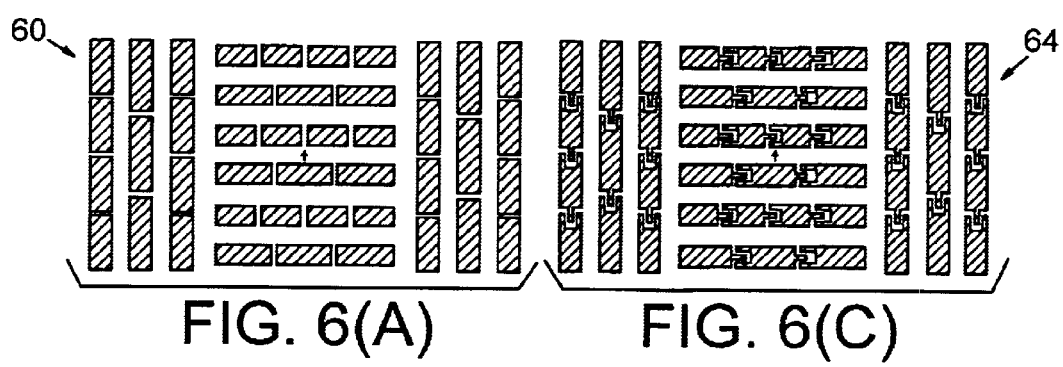
FIGS. 6(A)–6(C) are plan views of respective alternative configurations of split FIA alignment-mark patterns similar to the alignment-mark patterns in FIGS. 5(A)–5(C), respectively, except that, in FIGS. 6(A)–6(C), the splits are staggered in adjacent pattern elements rather than being aligned with each other as in FIGS. 5(A)–5(C), respectively.
Figure 6B:
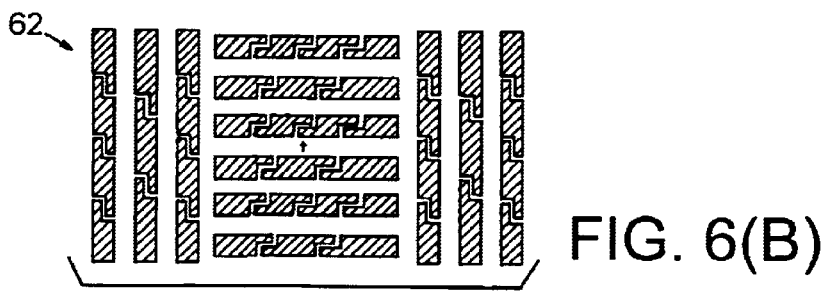

FIGS. 6(A)–6(C) depict respective alignment-mark patterns 60, 62, 64 that are configured similarly to corresponding alignment-mark patterns 50, 52, 54 shown in FIGS. 5(A)–5(C), respectively, except that, in the alignment-mark patterns 60, 62, 64, the splits in adjacent pattern elements are staggered from one adjacent element to the other.

As understood from the representative embodiments shown in FIGS. 5(A)–5(C) and 6(A)–6(C), it will be understood that any of various mark-pattern-division schemes can be utilized to avoid the problem, in a stencil reticle defining an alignment-mark pattern, of stress-induced deformation and twisting of the corresponding pattern elements. I.e., the shapes, numbers, and positions of the girders are not limited to the examples shown in the figures. A stencil reticle defining any of these alignment-mark patterns can be used to form the respective alignment mark on a sensitized substrate simultaneously with forming the first layer on the substrate by CPB microlithography.

Furthermore, on the substrate, the alignment-mark girders desirably are configured to have respective widths no greater than the resolution limit of the optical system of the alignment-detection device (e.g., a width of 1.83 μm or less in an FIA optical system). Thus, the accuracy with which the alignment marks can be detected is undiminished relative to the accuracy conventionally obtained using the non-split alignment mark shown, for example, in FIG. 10(B).

The representative embodiments of alignment-mark patterns described above all comprised certain pattern elements that extend in a first dimension (e.g., the X dimension), and other pattern elements that extend in a second dimension (e.g., the Y dimension) perpendicular to the first dimension. These configurations are not intended to be limiting. Depending upon the specific alignment requirements for which a corresponding alignment mark is configured, certain pattern elements of an alignment-mark pattern according to the invention could have a relative orientation that is not perpendicular. Furthermore, as an alternative to having respective pattern elements that extend in different dimensions, an alignment-mark pattern could consist of pattern elements that extend only in one dimension.

A representative embodiment of a stencil reticle 70 including an alignment-mark pattern according to any of the representative embodiments described above is shown in FIG. 7. The depicted reticle 70 defines not only the alignment-mark pattern 71 but also includes circuit-pattern (device-pattern) regions 72 that define the pattern to be transferred to the sensitized substrate. The pattern (along with the alignment-mark pattern 71) is transferred to the substrate using a charged particle beam. On the substrate, the corresponding alignment mark is detectable with high accuracy using an optical alignment-detection device (e.g., FIA device). Desirably, the reticle 70 is a scattering-stencil-type reticle that does not absorb charged particles of an illumination beam incident on the reticle membrane. By thus avoiding absorption of incident charged particles by the reticle 70, temperature rise of the reticle during use is reduced. The lower operating temperature of the reticle results in less pattern deformation during use, allowing pattern transfer to be performed at high accuracy.

Figure 8:
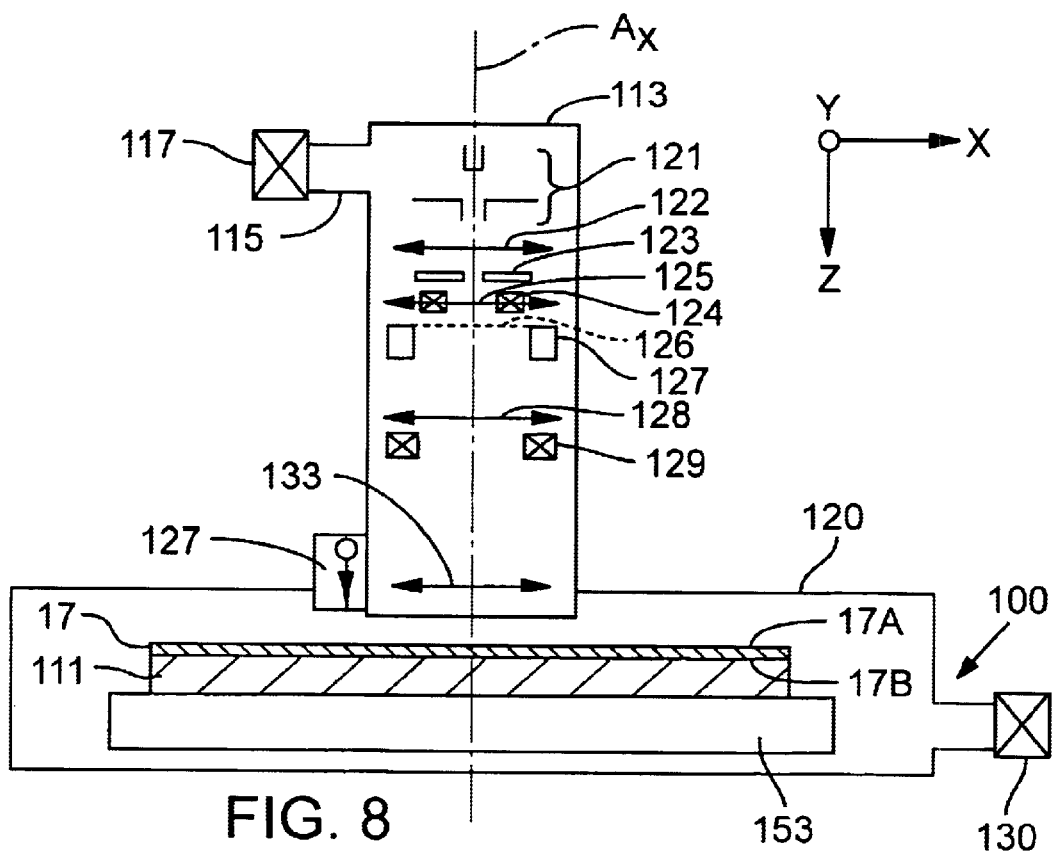
FIG. 8 is a schematic elevational view of a representative embodiment of an electron-beam (as an exemplary charged-particle-beam) microlithography apparatus with which a stencil reticle including an alignment-mark pattern according to the invention is usable.
Figure 9:
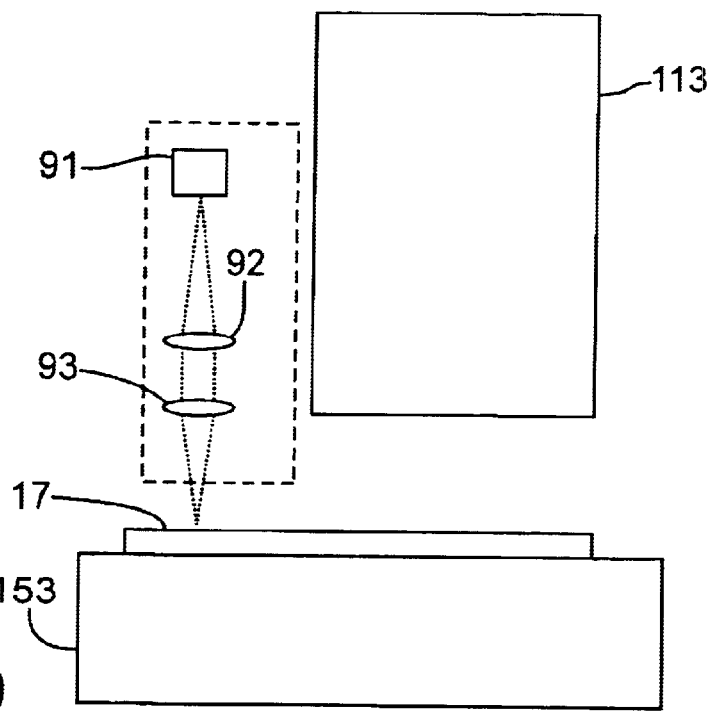
FIG. 9 is a schematic elevational view showing certain components of the optical alignment-detecting device used in the apparatus of claim 8.

A representative embodiment of a CPB microlithography method performed using any of the reticle embodiments described above is depicted in FIGS. 8 and 9. FIG. 8 is a schematic elevational view of the microlithography apparatus (described in the context of using an electron beam as the exemplary charged particle beam), and FIG. 9 is an enlarged view of a portion of the optical alignment-detection device in the apparatus of FIG. 8.

Turning first to FIG. 8, an electron gun 121 is situated at the extreme upstream end of the depicted electron-optical system. The electron gun emits an electron beam in the downstream direction (downward in the figure). Downstream of the electron gun 121 are, in order, a condenser-lens system 122, a beam-shaping aperture 123, an illumination-region-selection deflector 124, an illumination lens 125, and a reticle 126 mounted on a reticle stage 127. The components situated between the electron gun 121 and the reticle 126 constitute the "illumination-optical system", and the electron beam propagating through the illumination-optical system is termed the "illumination beam".

The beam-shaping aperture 123 trims the illumination beam as required to illuminate an exposure-unit region (usually termed a "subfield") having a defined size and shape on the reticle 126. A focused image of the opening in the beam-shaping aperture 123 is formed on the reticle 126 by the illumination lens 125.

The illumination-optical system also typically includes a blanking deflector and a blanking aperture (not shown but well understood in the art) that, along with the illumination-region-selection deflector 124, are situated downstream of the beam-shaping aperture 123. In instances in which illumination of the reticle 126 is not required or desired, the blanking deflector laterally deflects the illumination beam as required to be blocked by the aperture plate defining the blanking aperture rather than passing through the opening defined by the aperture plate of the blanking aperture. The illumination-region-selection deflector 124 mainly scans the illumination beam successively in the X direction in FIG. 8 so as to illuminate, in a sequential manner, the subfields on the reticle 126 located within the optical field of the illumination-optical system.

The illumination lens 125 is situated downstream of the beam-shaping aperture 123 and is used to collimate the illumination beam for illumination of the selected region of the reticle 126. Thus, an image of the opening in the beam-shaping aperture is formed on the surface of the reticle 126 in the selected illumination region (subfield).

Figure 7:
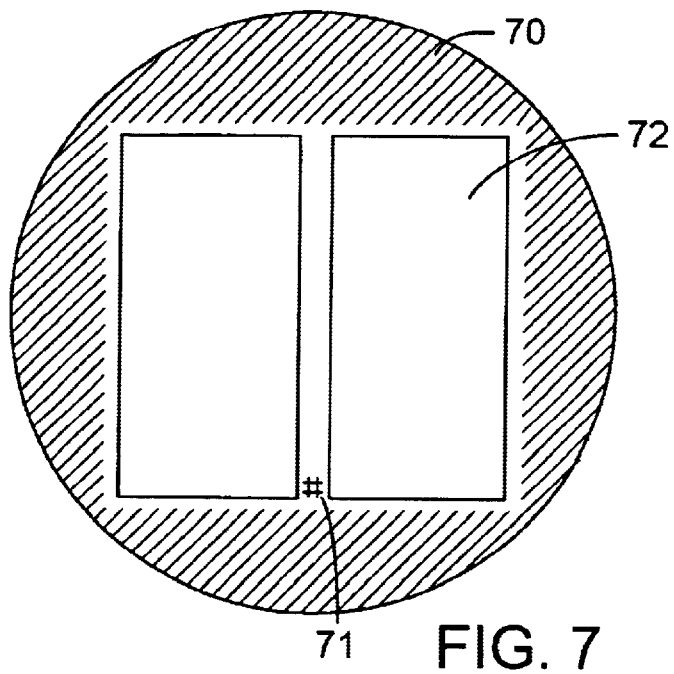
FIG. 7 is a schematic plan view of an embodiment of a stencil reticle including an alignment-mark pattern such as any specifically disclosed herein.

The reticle 126 is typically a stencil-type reticle as shown generally in FIG. 7. The reticle 126 extends in the plane perpendicular to the optical axis Ax (i.e., the reticle 126 extends in the X-Y plane in the figure). The reticle 126 normally defines an entire pattern to be formed in a respective layer of a single "chip" (comprising a respective microelectronic device) to be formed on a substrate (e.g., semiconductor wafer).

The periphery of the reticle 126 is held on the reticle stage 127, which is movable in the X and Y directions. The reticle stage 127 moves the reticle 126 so as to position the reticle 126 appropriately for illumination of desired subfields lying outside the optical field of the illumination optical system. As noted above, the exposure-region-selection deflector 124 laterally deflects the illumination beam as required for illuminating subfields lying within the optical field of the illumination-optical system.

Situated downstream of the reticle 126 is a "projection-optical system" comprising first and second projection lenses 128, 133, respectively, and a deflector 129. As the illumination beam illuminates a particular subfield on the reticle 126, the portion of the beam passing through the reticle carries an "aerial image" of the respective pattern portion defined in the illuminated subfield. This beam carrying the aerial image to the substrate 17 is termed the "patterned beam". The patterned beam is "reduced" (i.e., the aerial image is demagnified), shaped appropriately by the projection lenses 128, 133, and deflected as required by the deflector 129 to imprint the aerial image at a desired location on a sensitized surface 17A of the substrate 17. Being "sensitized", the upstream-facing surface 17A of the substrate 17 is coated with an image-imprintable substance (termed a "resist") that undergoes differential chemical changes as a function of local exposure energy by the patterned beam. As noted above, the image as imprinted on the sensitized surface 17A is demagnified relative to the respective pattern portion defined on the reticle 126.

The illumination-optical system and projection-optical system are contained in a chamber 113, termed a "column", that is evacuated by a vacuum pump 117 or the like to an appropriate vacuum level to allow unimpeded propagation of the illumination beam and patterned beam. The vacuum pump 117 is connected to the chamber 113 via a vacuum conduit 115.

For exposure the substrate 17 is mounted on a "chuck" 111 that, in turn, is mounted on a substrate stage 153. Specifically, the downstream-facing surface 17B of the substrate 17 contacts the chuck 111, which facilitates conduction of heat away from the substrate during exposure. The substrate stage 153, chuck 111, and substrate 17 are housed in a chamber 120 that is evacuated to a suitable vacuum level by a vacuum pump 130 connected to the chamber 120.

The apparatus of FIG. 8 includes an optical alignment-detection device 137 that detects the position of an alignment mark on the surface 17A of the substrate 17 using optical means. The substrate stage 153 is actuated (for movement in its X-Y plane) based on substrate-position data obtained by the alignment-detection device 137. Thus, each portion of the pattern defined on the reticle 126 is exposed at the desired location on the sensitized surface 17A.

By way of example, the alignment-detection device 137 can be an optical microscope as shown schematically in FIG. 9. The depicted microscope comprises optical lenses 92, 93 that produce an enlarged image of the alignment mark on an image detector 91 such as a CCD. The image formed on the image detector 91 is processed electronically to produce mark-position data. The microscope utilizes light from a light source (not shown) that emits light of a wavelength to which the resist on the sensitized surface 17A is not sensitive. From the light source, an illumination system (not shown) irradiates the alignment mark with light from the light source. The lenses 92, 93 comprise a detection-optical system that enlarges and projects an image of the alignment mark onto the detector 91. Thus, the various positions of the alignment mark are detected with high accuracy. Accuracy is increased by increasing the numerical aperture of the detection optical system 92, 93 to obtain a high-contrast alignment-mark image at the detector 91.

As described above, alignment-mark patterns defined in a stencil reticle can be transferred to a lithographic substrate using a CPB microlithography apparatus. The alignment marks thus formed on the substrate can be detected using an alignment-detection device in a CPB microlithography apparatus and also can be detected using an alignment-detection-device (e.g., FIA-based) in an optical microlithography apparatus. Thus, position detection of the substrate can be accomplished with high accuracy in either type of microlithography apparatus.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An alignment-mark pattern defined on a stencil reticle used in charged-particle-beam microlithography, the alignment-mark pattern comprising:
   pattern elements defined as respective apertures in the stencil reticle, each of the pattern elements being split into respective pattern-element portions that are separated by respective girders formed from a membrane of the stencil reticle, so as to avoid forming membrane islands in the reticle and to prevent stress-based deformation of the pattern elements in the reticle; and
   the alignment-mark pattern being configured for lithographic transfer, using a single exposure shot of a charged particle beam, from the stencil reticle to a sensitized substrate so as to imprint on the substrate a corresponding alignment mark that is detectable using an optical-based alignment-detection device and that includes the girders resolved between the respective pattern-element portions but not resolvable by the optical-based alignment-detection device.

2. The alignment-mark pattern of claim 1, wherein the pattern elements include pattern elements defining corresponding alignment-mark elements that intersect each other.

3. The alignment-mark pattern of claim 2, wherein the girders extend across respective pattern elements at regions of intersection of the pattern elements.

4. The alignment-mark pattern of claim 2, wherein the pattern elements include girders that extend across respective pattern elements at regions displaced from regions of intersection.

5. The alignment-mark pattern of claim 1, wherein the pattern elements are non-intersecting with each other.

6. The alignment-mark pattern of claim 5, wherein the pattern elements include a first group that are separate from but oriented perpendicularly to a second group.

7. The alignment-mark pattern of claim 1, wherein each girder defines a corresponding alignment-mark girder, in the corresponding alignment mark, having a width that is no greater than a resolution limit of the optical-based alignment-detection device.

8. A stencil reticle, comprising an alignment-mark pattern as recited in claim 1.

9. The stencil reticle of claim 8, further configured as a scattering-stencil reticle.

10. A substrate, imprinted with an alignment mark corresponding to the alignment-mark pattern as recited in claim 1.

11. A stencil reticle for use in charged-particle-beam microlithography, comprising:
   a reticle membrane; and
   an alignment-mark pattern comprising multiple pattern elements defined as respective apertures in the reticle membrane, each of the pattern elements on the reticle being split into respective pattern-element portions that are separated by respective girders formed from the reticle membrane, the alignment-mark pattern being configured to be transferred lithographically from the stencil reticle by a single exposure shot of a charged particle beam to a sensitized substrate so as to imprint on the substrate a corresponding alignment mark that is detectable using an optical-based alignment-detection device, and that includes the girders resolved between the respective pattern-element portions but not resolvable by the optical-based alignment-detection device.

12. The stencil reticle of claim 11, further defining a device pattern.

13. The stencil reticle of claim 12, wherein the device pattern is defined in a first region of the reticle and alignment-mark pattern is defined in a second region of the reticle separate from the first region.

14. The stencil reticle of claim 11, wherein the pattern elements include pattern elements that intersect each other.

15. The stencil reticle of claim 14, wherein the girders extend across respective pattern elements at regions of intersection of the corresponding alignment-mark elements.

16. The stencil reticle of claim 14, wherein the pattern elements include girders that extend across respective pattern elements at regions displaced from regions of intersection.

17. The stencil reticle of claim 11, wherein the pattern elements are non-intersecting with each other.

18. The stencil reticle of claim 11, wherein each girder defines a respective alignment-mark girder, in the respective alignment mark, having a width that is no greater than a resolution limit of the optical-based alignment-detection device.

19. The stencil reticle of claim 11, wherein the reticle membrane comprises a charged-particle-scattering material.

20. A substrate, imprinted with an alignment mark corresponding to the alignment-mark pattern on the stencil reticle as recited in claim 11.

21. In a microlithographic method, a method for determining an alignment of a lithographic substrate, the method comprising:

providing a stencil reticle as recited in claim 11;

lithographically transferring the alignment-mark pattern on the reticle to a sensitized substrate using a charged particle beam so as to imprint the corresponding alignment mark on the substrate; and detecting the alignment mark on the substrate to determine alignment of the substrate.

22. In a microlithographic method, a method for determining an alignment of a lithographic substrate, the method comprising:

on a stencil reticle, defining an alignment-mark pattern comprising pattern elements defined as respective apertures in a membrane of the stencil reticle, each of the pattern elements on the reticle being split into respective pattern-element portions that are separated from each other by respective girders formed from the membrane, so as to avoid forming membrane islands in the reticle and to prevent stress-based deformation of the pattern elements in the reticle;

lithographically transferring the alignment-mark pattern from the reticle to a sensitized substrate using a single exposure shot of a charged particle beam so as to imprint on the substrate the corresponding alignment mark that includes the girders resolved between the respective pattern-element portions but not resolvable by an optical-based alignment-detection device; and detecting the alignment mark on the substrate to determine alignment of the substrate.

23. The method of claim 22, wherein the detecting step is performed using an optical-based alignment-detection device.

24. The method of claim 23, wherein the optical-based alignment-detection device is an FIA-based device.

25. The method of claim 22, wherein, in the defining step, the pattern elements are defined to include pattern elements that intersect each other.

26. The method of claim 25, wherein, in the defining step, the girders are defined so as to extend across respective pattern elements at regions of intersection of the corresponding alignment-mark elements.

27. The method of claim 25, wherein, in the defining step, the pattern elements are defined to include girders that extend across respective pattern elements at regions displaced from regions of intersection of the corresponding alignment-mark elements.

28. The method of claim 22, wherein, in the defining step, the pattern elements are defined so as not to intersect with each other.

29. The method of claim 28, wherein, in the defining step, the pattern elements are defined so as to include a first group of pattern elements that is separate from but oriented perpendicular to a second group of pattern elements.

30. The method of claim 22, wherein:

the detecting step is performed using an optical-based alignment-detection device; and in the defining step, each girder is configured to form a corresponding alignment-mark girder, in the corresponding alignment mark, having a width that is no greater than a resolution limit of the optical-based alignment-detection device.

* * * * *

UNITED STATES PATENT AND TRADEMARK OFFICE
CERTIFICATE OF CORRECTION

PATENT NO. : 6,750,464 B2
DATED : June 15, 2004
INVENTOR(S) : Udagawa et al.

It is certified that error appears in the above-identified patent and that said Letters Patent is hereby corrected as shown below:

Column 8,
Line 64, "element $55_v$," should read -- element $55_H$, --.

Column 12,
Line 48, "claim 8, further configured" shoud read -- claim 8, configured --.

Signed and Sealed this

Twenty-fourth Day of May, 2005

JON W. DUDAS
*Director of the United States Patent and Trademark Office*